(12) United States Patent
Gupta (10) Patent No.: US 10,651,868 B2
(45) Date of Patent: *May 12, 2020

(54) MODULATORS

(71) Applicant: Cirrus Logic International Semiconductor Ltd., Edinburgh (GB)

(72) Inventor: Sri Ram Gupta, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,581

(22) Filed: Dec. 27, 2018

(65) Prior Publication Data

US 2019/0190532 A1 Jun. 20, 2019

Related U.S. Application Data

(63) Continuation of application No. 15/882,347, filed on Jan. 29, 2018, now Pat. No. 10,171,101.

(60) Provisional application No. 62/608,226, filed on Dec. 20, 2017.

(51) Int. Cl.
| | | |
|---|---|---|
| H03M 1/50 | (2006.01) | |
| H03K 3/03 | (2006.01) | |
| H03K 5/24 | (2006.01) | |
| H03K 3/012 | (2006.01) | |
| H03K 7/08 | (2006.01) | |
| H03K 19/21 | (2006.01) | |

(52) U.S. Cl.
CPC ............ *H03M 1/50* (2013.01); *H03K 3/012* (2013.01); *H03K 3/0315* (2013.01); *H03K 5/24* (2013.01); *H03K 7/08* (2013.01); *H03K 19/21* (2013.01)

(58) Field of Classification Search
CPC ....... H03M 1/50; H03K 3/012; H03K 3/0315; H03K 5/24; H03K 19/21
USPC .......................................... 341/143, 155, 166
See application file for complete search history.

(56) References Cited

U.S. PATENT DOCUMENTS

| | | | |
|---|---|---|---|
| 8,564,471 B1 * | 10/2013 | Gao | G04F 10/005 |
| | | | 341/166 |
| 9,705,519 B1 * | 7/2017 | Baringer | H03M 7/3073 |
| 10,171,101 B1 * | 1/2019 | Gupta | H03K 7/08 |

* cited by examiner

*Primary Examiner* — Khai M Nguyen
(74) *Attorney, Agent, or Firm* — Jackson Walker L.L.P.

(57) ABSTRACT

This application relates to modulators for providing time-encoded signals and in particular PWM signals. A modulator (200) has a first controlled oscillator (201P) configured to receive a first oscillator driving signal and output a first oscillation signal (S1). An accumulator (204) is configured to provide an accumulator value (VAL) based on a number of pulses of the first oscillation signal and a hysteretic comparator (205) alternates between first and second output states based on a hysteretic comparison of the accumulator value with a defined reference (REF). The first oscillator driving signal is based on a combination of an input signal and a feedback signal derived from an output of the hysteretic comparator. A second controlled oscillator (201N) may be configured to receive a second oscillator driving signal and output a second oscillation signal (S2) and the accumulator may provide the accumulator value based on a difference in the number of pulses of the first oscillation signal and the second oscillation signal.

20 Claims, 4 Drawing Sheets

MODULATORS

FIELD OF DISCLOSURE

The field of representative embodiments of this disclosure relates to methods, apparatus and/or implementations concerning or relating to modulators for signal modulation, and especially to time-encoding modulators such as modulators to generate pulse-width modulation signals.

BACKGROUND

Signal modulators are utilized in a number of applications, for instance as part of the conversion from analogue signals to digital signals or vice versa. Time-encoding modulators are modulators that encode input data into a time-encoded data stream.

One particular form of time-encoding is pulse-width modulation (PWM). In a PWM signal an input value is encoded by the duration of a given output signal level, e.g. the duration or width of pulse of a first signal level, compared to the duration of any period(s) of any other signal level(s) in a cycle period. For a conventional two-level PWM signal, the input signal value may be encoded by the duty cycle of a pulse of a first signal level within the cycle period, i.e. the proportion of the cycle period spent at the first output signal level.

One particular application of a time-encoding modulator is as part of an analogue-to-digital converter (ADC) having a controlled oscillator, such as a voltage-controlled-oscillator (VCO).

In a VCO based ADC the input analogue signal may be used to control the VCO, which thus outputs an oscillation signal with a frequency dependent on the value of the input signal. The frequency of the oscillation signal is determined, for instance by counting the number of cycles of the oscillation signal in a defined frame period, to provide a digital output indicative of the value of the input signal. The VCO can be implemented by a relatively simple ring oscillator, which is relatively low power, and thus VCO based ADCs can be relatively efficient in terms of power requirements and circuit area compared to alternative ADC architectures such as continuous-time or discrete-time sigma-delta ADCs.

However VCOs, especially those based on ring oscillators, typically have relatively poor linearity. Thus if the VCO is controlled directly by the analogue input signal the resulting digital output signal may have poor linearity. Whilst this may be acceptable for some applications, the poor linearity is disadvantageous for audio applications.

A time-encoding modulator, for instance a PWM modulator, can be used to improve the linearity of a VCO based ADC by modulating the input analogue signal into a time-encoded signal which varies between two voltage states, where the value of the input signal is encoded by the relative durations of each state. The time-encoded signal is then used to control the VCO. As the VCO thus only operates with two input voltage levels the output is inherently linear. The average frequency of the oscillation signal in a frame period depends on the time spent at each voltage level, and thus depends on the value of the input signal.

Figure 1:
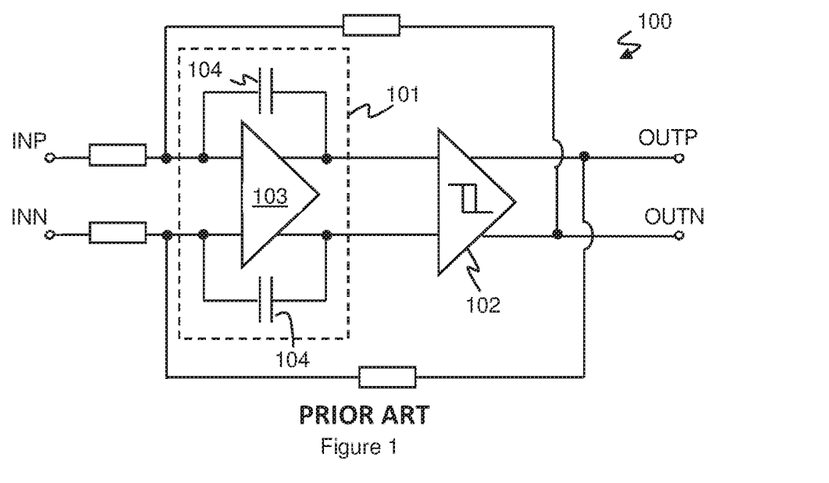
FIG. 1 illustrates an example of a conventional asynchronous sigma-delta modulator.

Typically the time-encoding modulator used in such applications comprises an asynchronous sigma-delta modulator (ASDM). FIG. 1 illustrates one example of an ASDM 100, which in this example is a differential ASDM, but ASDMs for single-ended signals would have a similar general design as would be understood by one skilled in the art. The differential input signal at inputs INP and INN is combined with a feedback signal and supplied to integrator 101 which provides the integrated signal to hysteretic comparator 102. As will be well understood by one skilled in the art, this arrangement provides, at a first output OUTP, a PWM signal that varies between two voltage states, say a high level $V_H$ and a low level $V_L$, where the relative duration of each state depends on the input signal. For the differential arrangement illustrated a second output OUTN is in antiphase with OUTP so as to provide a differential PWM signal.

The integrator 101 typically comprises an op-amp 103 with integrator capacitors 104. When used for audio ADC applications, the performance requirements typically mean that a relatively large op-amp 103 with a relatively high power consumption is implemented. The integrator capacitors also need to be relatively large. Generally there is a desire for circuitry to be as small as possible and, especially for battery powered devices, power consumption is a concern and low power operation is desirable.

SUMMARY

Embodiments of the present disclosure relate to improved time-encoding modulators that at least mitigate at least some of these issues.

According to some embodiments there is provided a time-encoding modulator comprising:
- a first controlled oscillator configured to receive a first oscillator driving signal and output a first oscillation signal;
- an accumulator configured to provide an accumulator value based on a number of pulses of the first oscillation signal; and
- a hysteretic comparator configured to output either a first output state or a second output state and to alternate between said first and second output states based on a hysteretic comparison of said accumulator value with a defined reference;
- wherein the first oscillator driving signal is based on a combination of an input signal and a feedback signal derived from an output of the hysteretic comparator.

In some embodiments the time encoding modulator may further comprise: a second controlled oscillator configured to receive a second oscillator driving signal and output a second oscillation signal. The accumulator may be configured to provide an accumulator value based on a difference in the number of pulses of the first oscillation signal and the second oscillation signal.

The time-encoding modulator may be a differential time encoding modulator having first and second input nodes for receiving a differential input signal and first and second output nodes for outputting a differential PWM signal. The first oscillator driving signal may be based on a signal received at the first input node combined with feedback from the first output node and the second oscillator driving signal may be based on a signal received at said second input node combined with feedback from said second output node.

The accumulator may be configured to increment the accumulator value for each instance of a defined signal transition of the first oscillation signal and decrement the accumulator value for each instance of a defined signal transition of the second oscillation signal.

In some implementations the accumulator may comprise a capacitor and at least one current source configured to charge the capacitor for each instance of the defined signal transition of the first oscillation signal and the discharge the capacitor for each instance of the defined signal transition of the first oscillation signal. The accumulator may comprise: a first exclusive-OR gate configured to receive the first oscillation signal at one input and a delayed version of the first oscillation signal at another input, the first exclusive-OR gate being configured to control a first current source configured to charge the capacitor; and a second exclusive-OR gate configured to receive the second oscillation signal at one input and a delayed version of the second oscillation signal at another input, the second exclusive-OR gate being configured to control a second current source configured to discharge the capacitor. The hysteretic comparator may, at least in such cases, comprise a voltage comparator.

In some implementations the accumulator may comprise an up/down counter configured to receive the first oscillation signal and the second oscillation signal and to increment a count value for each pulse of the first oscillation signal and to decrement the count value for each pulse of the second oscillation signal. In at least such cases the hysteretic comparator may comprise a digital comparator.

The first controlled oscillator and the second controlled oscillator (if present), may each comprise a current controlled oscillator. The current controlled oscillator may comprise: a ring oscillator comprising an plurality of inverters; a control node coupled to supply terminals of the inverters for receiving the first or second oscillator driving signal as appropriate; and a regulation amplifier configured to monitor a voltage at the control node to an oscillator reference voltage and to output a tuning voltage to the inverters to maintain the voltage at said control node to be equal to the oscillator reference voltage.

In some implementations the time encoding modulator is configured to receive an input analogue audio signal. In some implementations the time encoding modulator may be implemented as an integrated circuit.

Embodiments also relate to analogue to digital converter comprising a time-encoding modulator as described in any of variants herein.

The analogue to digital converter may comprise at least one further controlled oscillator and a counter, wherein the at least one further controlled oscillator is driven by the output state of the hysteretic comparator and the counter is configured to generate a count value based on the number of pulses in an output of the at least one further controlled oscillator in a frame period defined a received clock signal.

When the time-encoding modulator is a differential time-encoding modulator, the analogue to digital converter may comprise: a third controlled oscillator configured to receive an oscillator driving signal from the first output node of the time-encoding modulator and generate a third oscillation signal; a fourth controlled oscillator configured to receive an oscillator driving signal from the second output node of the time-encoding modulator and generate a fourth oscillation signal; and a counter configured to generate a count value based on the difference in the number of pulses of the third and fourth oscillations signals in a frame period defined a received clock signal. The third and fourth controlled oscillators may be the same type of controlled oscillator as the first and second controlled oscillators.

Aspects also relate to an electronic device comprising a time encoding modulator or an analogue to digital converter as described in any of the variants herein. The electronic device may be at least one of: a portable device; a device operable with battery power; a communication device; a mobile or cellular telephone or a smartphone; a computing device; a notebook, laptop or tablet computer; a wearable device; a device with voice control or voice activation functionality; an accessory device; a headset.

In another aspect there is provided a time-encoding modulator comprising:
first and second input nodes for receiving a differential input signal comprising respective first and second input signal components;
first and second output nodes for outputting a differential time-encoded signal comprising respective first and second output signal components;
first and second controlled oscillators, each of the first and second controlled oscillators being configured to be driven by a different one of the first and second input signal components combined with a different one of the first and second output signal components to produce respective first and second oscillation signals;
an accumulator configured to provide an accumulator value based on a difference in the number of signal transitions of the first and second oscillation signals; and
a hysteretic comparator configured to compare with hysteresis said accumulator value with a reference value to generate first and second output signal components.

In another aspect there is provided a PWM modulator for receiving an input signal and outputting PWM signal, the modulator comprising:
an integrator module configured to receive the input signal combined with a feedback signal derived from the PWM signal and generate an accumulator value; and
a hysteretic comparator configured to compare with hysteresis the accumulator value with a reference to generate the PWM signal;
wherein the integrator module comprises first and second controlled oscillators and an accumulator for providing an accumulator value based on the difference in a number of signal transitions in outputs of the first and second oscillators,
wherein at the least the first controlled oscillator is driven by said input signal combined with the feedback signal.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to time-encoding signal modulators and in particular to PWM (pulse-width modulation) modulators. Some embodiments also relate to signal processing circuits including such time-encoding modulators, for example a controlled oscillator based ADC (analogue-to-digital converter). In embodiments of the present invention the time-encoding modulator comprises a controlled oscillator and a hysteretic comparator.

Figure 2:
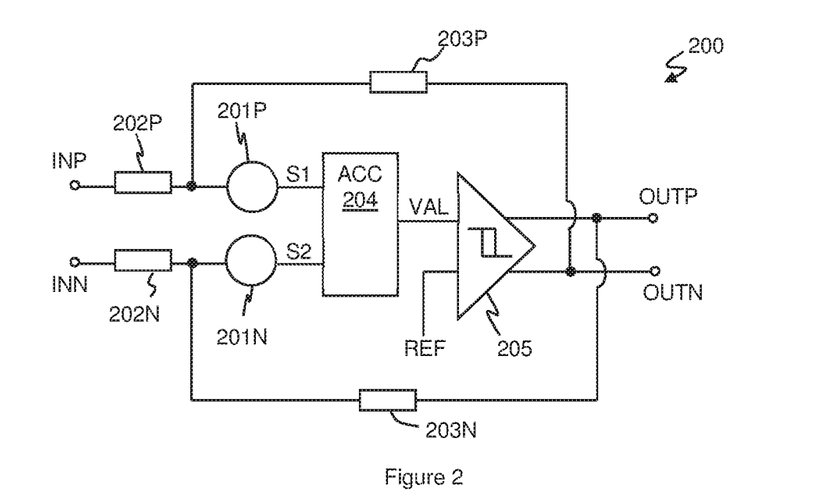
FIG. 2 illustrates an example of a time-encoding modulator according to an embodiment.

FIG. 2 illustrates generically a time-encoding modulator 200 according to an embodiment of the disclosure. FIG. 2 illustrates a time-encoding modulator for receiving a differential input signal and thus has first and second inputs INP and INN for first and second processing paths respectively, however some embodiments may operate with a single-ended input signal. For each of the first and second processing paths, feedback from an output of the time-encoding modulator is combined with the input signal and the combined signal is supplied to respective controlled oscillators 201P and 201N (collectively or individually 201). In the example illustrated in FIG. 2 the controlled oscillators 201 are current-controlled-oscillators (ICOs) and thus the first and second processing paths have respective input resistors 202P and 202N (collectively 202) and the feedback paths comprise respective feedback resistors 203P and 203N (collectively 203) so as convert the input and output voltages into respective signal currents which combine to form the oscillator driving signal.

The ICOs 201 in the processing paths thus each receive an input driving signal which depends on the input signal components for that processing path combined with a feedback signal for that processing path. The first and second ICOs 201P and 201N produce respective first and second oscillation signals S1 and S2 that are supplied to an accumulator 204, which in the example of FIG. 2 is differential accumulator.

The differential accumulator 204 acts to provide an accumulator value based on the frequencies of the first and second oscillation signals. In the embodiment of FIG. 2 the differential accumulator 204 acts to provide an accumulator value VAL based on the number of pulses in the first and second oscillation signals. In embodiments the accumulator may determine the number of pulses by looking for defined signal transitions, i.e. defined pulse edges, in the oscillation signal. For example, in some embodiments the differential accumulator 204 may respond to rising edges (and/or equivalently falling edges) in the oscillation signal and may thus may accumulate a value based on the number of edges in the oscillation signal. For the differential accumulator 204 of FIG. 2, the accumulator 204 may be arranged to effectively increment the accumulator value, VAL, for each such edge in one of the first and second oscillation signals and decrement the accumulator value for each edge in the other of the first and second oscillation signals to provide a differential accumulator value. The accumulator value VAL may thus vary over time depending on whether there are more relevant signal transitions in the first oscillation signal or the second oscillation signal. The accumulator 204 responds to the first and second oscillation signals to update the accumulator value VAL it maintains.

Figure 3:
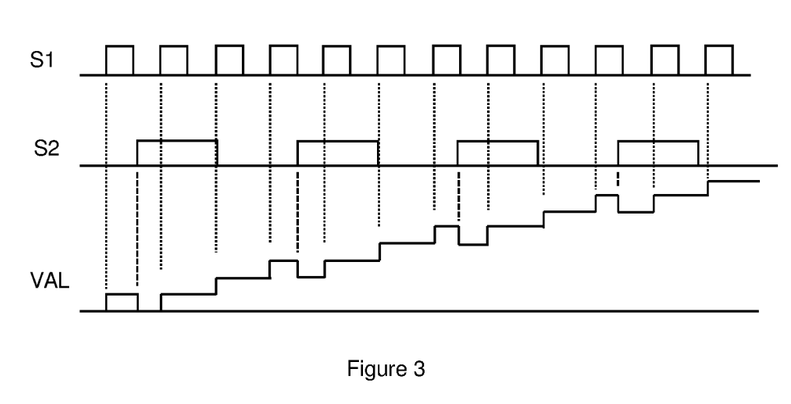
FIG. 3 illustrates the principle of providing an accumulator value.

FIG. 3 illustrates this principle. FIG. 3 shows examples of the first oscillation signal S1 and second oscillation signal S2. FIG. 3 also illustrates that the accumulation value VAL is incremented on every instance of a rising edge of the first oscillation signal S1 and decremented on every instance of a falling edge of the second oscillation signal S2. In this example, as the frequency of the first oscillation signal S1 is greater than that of the second oscillation signal S2, there are more edges of the first oscillation signal and the accumulator value VAL increases over time, with the general rate of increase being related to the difference in frequency between the two oscillation signals.

As will be explained in more detail later, in some embodiments the differential accumulator 204 may be at least partly implemented as a digital module and may for example provide the accumulator value VAL as a digital value, e.g. a count value or similar. In other embodiments the differential accumulator 204 may be at least partly implemented as an analogue module and in which case the accumulator value VAL could be a value of voltage or current.

The accumulator value VAL is provided to a hysteretic comparator 205, which in the example of FIG. 2 is a differential output comparator. The hysteretic comparator 205 compares the accumulator value to a reference value REF. The hysteretic comparator outputs either of two output states based on the comparison. In a first output state, the first output OUTP is at a high signal level, say a high voltage $V_H$, and the second output OUTN is at a low signal level, say a low voltage $V_L$. In the second output state the first output OUTP is at the low signal level, e.g. $V_L$, and the second OUTN is at the high signal level, e.g. $V_H$. Note as used herein the term "high" in relation to signal levels, voltages or values shall, unless the context requires otherwise, be taken to mean more positive/less negative than a "low" signal level or voltage. Terms such as increasing and decreasing, greater and lower etc. shall be interpreted accordingly, e.g. increasing means becoming more positive/less negative and decreasing means become less positive/more negative.

The hysteretic comparator 205 will maintain one output state until the difference between the received accumulator value VAL and the reference value increases to a first threshold, at which point it will swap to the second output state. The second output state will then be maintained until the difference between the received accumulator value and the reference value decreases to a second threshold, lower than the first threshold. For instance the first thresholds may be equal to REF+H1 and the second threshold may be equal to REF−H2, where H1 and H2 are defined by the hysteresis applied by the hysteretic comparator 205. In some implementations the hysteresis H may be symmetric, e.g. H1=H2=H.

Thus, for the example discussed with reference to FIG. 3, the accumulator value VAL provided to the hysteretic comparator 205 would, as illustrated, increase over time until the relevant threshold was reached, e.g. REF+H. At this point the output state of the hysteretic comparator 205 would change from one state to the other. As such the feedback contribution to each of the first and second processing paths varies, and hence the input to the controlled oscillators 201P and 201N also varies, with the result that the frequencies of the first and second oscillation signals, S1 and S2, vary.

The output state voltages $V_H$ and $V_L$ are scaled with respect to the input signal swing and any gain of resistors 202/203 so that, in one output state, the first oscillation signal S1 will have a greater frequency than the second oscillation signal S2 and, in the other output state, the first oscillation signal S1 will have a lower frequency than the second oscillation signal S2, for any input signal component.

In other words the feedback ensures that for one output state the first oscillator signal S1 will have a greater frequency, and hence more signal edges, than the second clock frequency and the accumulate value will increase over time in such a state. In the other state the second oscillator signal S2 will have the greater frequency, and hence more signal edges, and the accumulate value will decrease over time.

The rate at which the accumulator value VAL increase or decreases depends on the level of input signal. The feedback arrangement illustrated in FIG. 2 means that for one output state of the hysteretic comparator 205 the high voltage $V_H$ is fed back to the first processing path and the low voltage $V_L$ is fed back to the second processing path. In the other output state the high voltage $V_H$ is instead fed back to the second processing path with the low voltage $V_L$ fed back to the second processing path. If there is zero differential signal, i.e. the voltage at INP is equal to that at INN, then in the first output state the first oscillation signal will be at a frequency F1 and the second oscillation signal will be at a frequency F2, and in the other output state the first oscillation signal will be at the frequency F2 and the first oscillation signal will be at the frequency F1. Thus for a differential input signal of zero magnitude the accumulator value VAL will increment during one output state at the same rate as it decrements during the other output state, thus leading to a 50:50 ratio of pulse widths or a 50% duty cycle. However if there a non-zero differential signal component then this will alter the control input to each controlled oscillator 201 in the various output states leading to a difference in the rate at which the accumulator value VAL increments and decrements during the two output states. The relative durations of the output states, i.e. the duty cycle, thus varies with the input signal.

In the example illustrated in FIG. 2, the feedback to the first processing path, i.e. to be combined with the input signal from input INP, is derived from the second output OUTN, and the feedback to the second processing path is derived from first output OUTP. This arrangement may be implemented when the accumulator is arranged to increment based on the first oscillation signal S1 and decrement based on the second oscillation signal S2 and the accumulator value is provided to a non-inverting input of the hysteretic comparator 205. It will be appreciated that other arrangements may be implemented in other embodiments.

Figure 4:
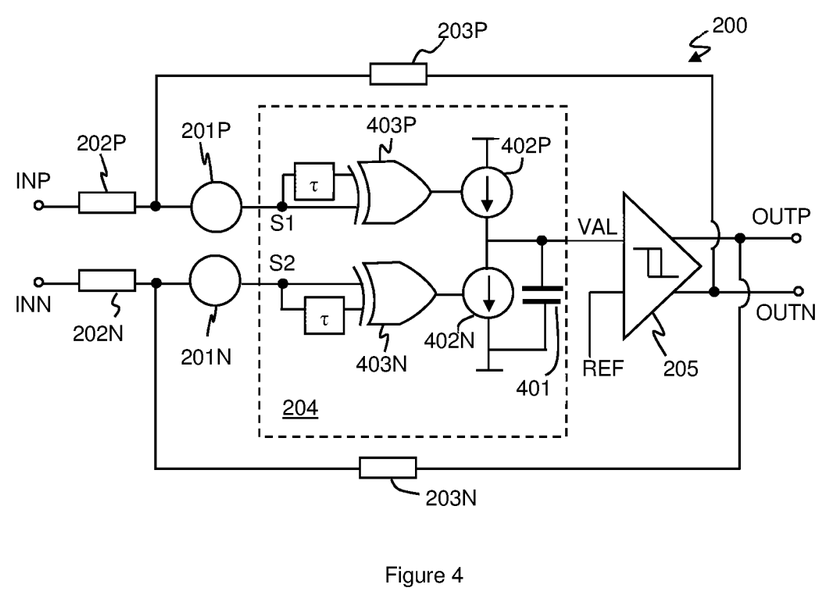
FIG. 4 illustrates an example of a time-encoding modulator with an analogue accumulator according to an embodiment.

As noted above in some embodiments the accumulator 204 could be implemented, at least partly, as an analogue accumulator. FIG. 4 illustrates one embodiment with an analogue accumulator 204. The accumulator 204 embodiment of FIG. 4 comprises a charge pump arrangement having a capacitor 401 charged or discharged by a current source arrangement, which in the embodiment of FIG. 4 comprises current sources 402P and 402N. The capacitor 401 is arranged as a reservoir capacitor to maintain the then-current accumulator value VAL as a voltage at an input to the hysteretic comparator 205. The accumulator 204 is arranged to charge the capacitor 401 by a defined amount for each edge, i.e. signal transition, of the first oscillator signal S1 and discharge the capacitor 401 by the defined amount for each edge of the second oscillator signal S2. First and second current sources 402P and 402N are thus arranged to be activated to charge or discharge the capacitor 401 respectively on an edge of the relevant oscillation signal. To detect the signal edges and ensure that a defined amount of charge is delivered, first and second exclusive-OR (XOR) gates 403P and 403N are arranged to receive the respective oscillation signal S1 or S2 and also a version of the respective oscillation signal S1 or S2 which has been delayed by a defined delay τ. The duration τ is chosen to be shorter than the minimum expected pulse duration of the oscillation signal. This arrangement outputs from the XOR gates 403P and 403N a pulse of duration τ for each rising and each falling edge in the relevant oscillation signal.

Consider the oscillation signal S1. If both the oscillation signal S1 received at one input of the XOR gate 403P and the delayed version received at the other input are both low, the output of the XOR gate 403P will be low and current source 402P will not be activated. On a rising edge of the oscillation signal S1, the input of the XOR gate 403P receiving the undelayed version will go high, but the other input, being delayed will remain low. Thus the output of the XOR gate 403P will go high at a time defined by the rising edge of the oscillation signal S1. After the delay r, the delayed signal version of S1 will also go high and both inputs will be high, thus the output of the XOR gate 403P will go low. The XOR gate 403P will thus output a pulse of duration τ for each rising edge, activating the current source 402P for this defined period. Likewise when the oscillation signal S1 goes low, the input to XOR gate 403P receiving the undelayed version will go low, but the other input will remain high for the duration τ. Thus another pulse of duration τ will be output at a falling edge in the oscillation signal. Thus every edge in the oscillation signal S1 will result in the current source 402P being activated for a defined period to charge capacitor 401 by a defined amount. The operation of XOR gate 403N is similar for oscillation signal S2 but results in current source 402N being activated to discharge capacitor 401 by the defined amount.

In this embodiment the accumulator value VAL is thus a voltage value maintained by capacitor 401. The hysteretic comparator 205 may thus be a voltage comparator as would be well understood by one skilled in the art. The hysteretic comparator 205 may be provided with a reference voltage REF for comparison, which may correspond to a voltage of zero-magnitude input signal, for example a midlevel voltage $V_{MID}$ between $V_H$ and $V_L$. Note that the reference REF is shown as being supplied to a separate input of the hysteretic comparator 205 for ease of reference but in some embodiments the reference could be defined by the structure of the hysteretic comparator 205 and an express reference input may not be needed.

In further embodiments alternative analogue circuit techniques could be used to provide an analogue accumulator. For example a switched-capacitor integrator might be employed.

Figure 5:
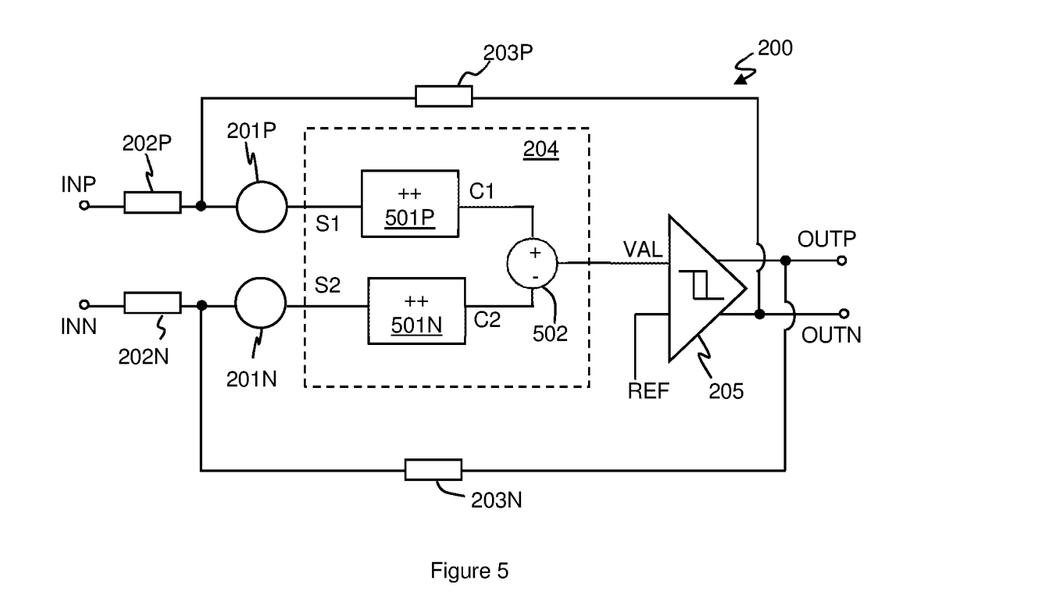
FIG. 5 illustrates an example of a time-encoding modulator with a digital accumulator according to an embodiment.

In some embodiments the accumulator 204 could be at least partly implemented as a digital module. For instance, referring back to FIG. 2, the accumulator 204 could be implemented as a digital up/down counter which increments for signal edges at one input, e.g. that receiving the first oscillation signal S1, and decrements for signal edges at another input, e.g. that receiving the second oscillation signal S2. Alternatively, as illustrated in FIG. 5 the accumulator 204 could comprise counters 501P and 501N arranged to count edges in the respective first and second oscillation signals, to provide first and second count values C1 and C2. In some embodiments the difference between the count values C1 and C2 could be determined, e.g. by arithmetic module 502, to expressly provide the accumulator value as a digital value VAL. The arithmetic module 502 may also apply synchronisation and delay matching for the count values and may be arranged to manage the count values of the counters 501P and 501N to prevent overflow, e.g. by resetting the counters at appropriate times, e.g. when C1=C2.

In some embodiments however the count values C1 and C2 could themselves by provided as inputs to the digital hysteretic comparator 205, i.e. the difference value VAL is provided to the comparator as the difference between the input count values, rather than being expressly determined by the accumulator 204. The hysteretic comparator 205 would then determine whether the count values differed by amounts based on a defined threshold reference value, e.g. if the difference between C1 and C2 greater than +H or lower than −H. In such implementations the hysteretic comparator 205 could be a digital comparator and the reference value could be a defined hysteresis reference value H.

The controlled oscillators 201 and accumulator 204 thus provide the functionality of the integrator 101 discussed above with respect to FIG. 1 but without requiring a relatively large and high power op-amp or large capacitances 204. The analogue or digital accumulators 204 discussed above can be implemented as small and low power circuitry.

The controlled oscillators 201 may be any type of controlled oscillator. In some embodiments the controlled oscillators 201 implemented as ring oscillators, which can be implemented as relatively small and low power components. In some embodiments the controlled oscillators may be current controlled oscillators with current regulation to improve linearity.

Figure 6:
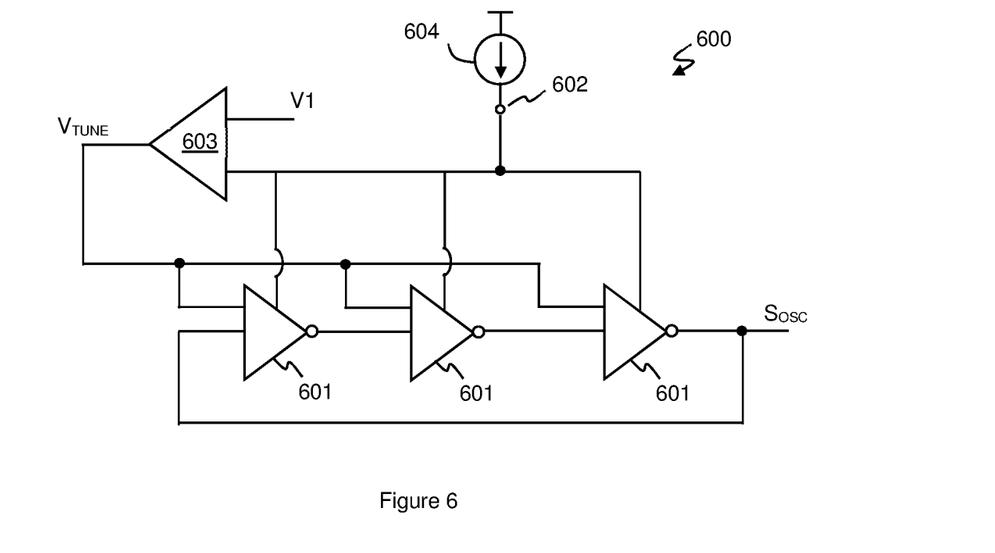
FIG. 6 illustrates an example of a controlled oscillator suitable for use in embodiments.

FIG. 6 illustrates an example of a controlled oscillator arrangement 600 that may advantageously be used for the controlled oscillators 201 of embodiments of the present disclosure. FIG. 6 illustrates a ring oscillator with a plurality of inverters 601 being arranged in a ring arrangement with, in this example, an odd number of inverters in the ring. Each inverter has a supply input driven from an input node 602 which receives an oscillator driving signal. Conventionally the voltage at the input 602 may be varied so as vary the drive strength of each inverter 601. This varies the propagation delay associated with each inverter 601, and hence the ring as will be understood by one skilled in the art. The ring can be tapped from one or more tap points to provide the oscillation signal $S_{OSC}$.

In the controlled oscillator as illustrated in FIG. 6 the voltage at the input node 602 is regulated by regulation amplifier 603. The regulation amplifier 603 compares the voltage at the input node 602 to a defined reference voltage V1 and outputs a tuning voltage $V_{TUNE}$ to each inverter 601 so as to maintain the voltage at the input node 602 equal to the defined reference voltage V1. The oscillator 600 is thus controlled by supply a current driving signal to the input node 602 and the oscillator acts as an ICO. In each cycle of oscillation of the ICO, a total effective capacitance Ctot will need to be charged and discharged through a voltage V1. Thus the current consumption will be equal to Ctot.V1.f where f is the oscillation frequency. If the supply voltage V1 is held constant the current consumption of the inverter is substantially proportional to the switching frequency of the inverters. Thus regulating the supply voltage means that output frequency of the oscillator can be controlled via controlling the input current, with a relatively linear relationship between current and frequency. Also, as the voltage across the controlled oscillator 600 is controlled, the controlled oscillator 600 exhibits a relatively low input impedance.

In use the current supply to the inverters 601 should be unipolar, e.g. the driving node 602 should always sink current to the inverters 601. Thus in some embodiments a DC current source 604 may be arranged to provide a defined current to the inverters, i.e. to combine with the current at node 602. This would allow for zero apparent quiescent input current to be supplied to this driving node 602 from outside the oscillator 600. The current from the DC current source 604 may be selected to provide a desired quiescent current into inverters 601 to give a nominal quiescent frequency with zero input current into node 602, avoiding any DC offset.

A regulated controlled oscillator such as illustrated in FIG. 6 can thus be advantageously be used for the controlled oscillator 201 of the time-encoding modulator of embodiments of the disclosure. The transfer function of the controlled oscillator is sufficiently linear to allow the controlled oscillator to replace the conventional op-amp based integrator of an ASDM. The low input impedance allows resistive feedback and avoids the need for low noise reference supplies.

Conveniently the two controlled oscillators 201P and 201N will have the same design and will be fabricated close to one another as part of an integrated circuit so that any process variations will affect both controlled oscillators in the same way and in use the controlled oscillators will be subject to substantially the same environmental conditions, e.g. temperature.

Figure 7:
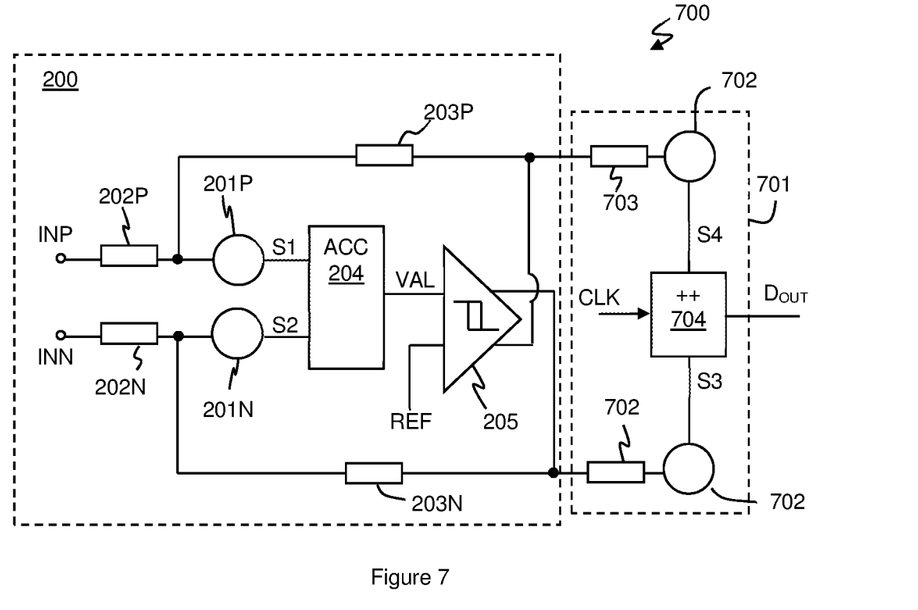
FIG. 7 illustrates an analogue-to-digital converter according to an embodiment.

The time-encoding modulator 200 may be used for a variety of different applications. One particular application, as noted above, is as part of an ADC circuit. FIG. 7 illustrates an ADC circuit 700 according to an embodiment. FIG. 7 illustrates a first stage which is a first time encoding modulator 200 such as described in the any of variants discussed above. In this embodiments the output differential PWM signal from the time encoding modulator 200 is input to a controlled-oscillator stage 701. This controlled oscillator stage comprises controlled oscillators 702 arranged to receive the PWM signals from the output of the hysteretic comparator 205. In some embodiments the controlled oscillators 702 may advantageous be regulated ICOs such as discussed above with reference to FIG. 6. As noted above such controlled oscillators exhibit relatively low input impedance and thus the input to the controlled oscillator stage may be a simple resistive input, e.g. via resistors 703. The controlled oscillators 702 generate third and fourth oscillation signals S3 and S4. As the input to the controlled oscillators 703 are the PWM signals generated by the time-encoding modulator 200, each of third and fourth oscillation signals S3 and S4 varies between just two frequencies. This provides an inherently linear output as discussed previously. Counter 704 counts the number of pulses of each oscillation signal S3 and S4 in frame period defined by a clock signal CLK and determines a difference between the counts as a digital output $D_{OUT}$.

An ADC according to embodiments of the disclosure can thus provide acceptable quality for audio applications but has advantages in terms of size and power consumption compared with the use of a conventional ASDM such as described with reference to FIG. 1.

In general therefore embodiments of the disclosure relate to time-encoding modulators, and in particular to PWM modulators, that use a controlled oscillator and an accumulator, or signal edge counter, to effectively provide an integration function. The controlled oscillator may in particular be a current feedback regulated ICO. Embodiments may be implemented in a range of applications and are suitable for audio applications. One particular application is for providing a PWM signal to allow linearization of controlled oscillator based ADC although the time-encoding modulator could also be used in also applications such as a Class-D amplifier.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality. In some instances the device could be an accessory device such as a headset or the like to be used with some other product.

It will be understood that the embodiments have been described with reference to differential embodiments. However embodiments are applicable to single-ended signals. For instance referring to FIG. 2 the input INP could receive a single ended signal. In some embodiments the second controlled oscillator 201N could be driven by a reference signal corresponding to the midpoint voltage of the signal range for the input signal at the input INP. Other arrangements are possible however, for instance a reference clock could be derived from other means and supplied as one input to the accumulator.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

At least some embodiments may be implemented in a host device, especially a portable and/or battery powered host device. Some embodiments may be implemented in an electronic device which may comprise at least one of: a communication device, a mobile or cellular telephone, a smartphone; a computing device; a laptop, notebook or tablet computing device; a media player; a games device; a wearable device; a smartwatch; a voice controlled device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope

The invention claimed is:

1. A time-encoding modulator comprising:
a first controlled oscillator configured to receive a first oscillator driving signal and output a first oscillation signal with a frequency that depends on the first oscillator driving signal;
an accumulator configured to provide an accumulator value based on a number of pulses of the first oscillation signal; and
a hysteretic comparator configured to output either a first output state or a second output state and to alternate between said first and second output states based on a hysteretic comparison of said accumulator value with a defined reference;
wherein the first oscillator driving signal is based on a combination of an input signal and a feedback signal derived from an output of the hysteretic comparator.

2. A time encoding modulator as claimed in claim 1 further comprising:
a second controlled oscillator configured to receive a second oscillator driving signal and output a second oscillation signal with a frequency that depends on the second oscillator driving signal;
wherein the accumulator is configured to provide an accumulator value based on a difference in the number of pulses of the first oscillation signal and the second oscillation signal.

3. A time encoding modulator as claimed in claim 2 wherein the time-encoding modulator is a differential time encoding modulator having first and second input nodes for receiving a differential input signal and first and second output nodes for outputting a differential PWM signal;
wherein the first oscillator driving signal is based on a signal received at said first input node combined with feedback from said first output node; and
the second oscillator driving signal is based on a signal received at said second input node combined with feedback from said second output node.

4. A time encoding modulator as claimed in claim 2 wherein the accumulator is configured to increment the accumulator value for each instance of a defined signal transition of the first oscillation signal and decrement the accumulator value for each instance of a defined signal transition of the second oscillation signal.

5. A time encoding modulator as claimed in claim 4 wherein the accumulator comprises a capacitor and at least one current source configured to charge the capacitor for each instance of the defined signal transition of the first oscillation signal and the discharge the capacitor for each instance of the defined signal transition of the first oscillation signal.

6. A time encoding modulator as claimed in claim 5 wherein the accumulator comprises:
a first exclusive-OR gate configured to receive the first oscillation signal at one input and a delayed version of the first oscillation signal at another input, the first exclusive-OR gate being configured to control a first current source configured to charge the capacitor; and
a second exclusive-OR gate configured to receive the second oscillation signal at one input and a delayed version of the second oscillation signal at another input, the second exclusive-OR gate being configured to control a second current source configured to discharge the capacitor.

7. A time encoding modulator as claimed in claim 5 wherein the hysteretic comparator comprises a voltage comparator.

8. A time encoding modulator as claimed in claim 2 wherein the accumulator comprises an up/down counter configured to receive the first oscillation signal and the second oscillation signal and to increment a count value for each pulse of the first oscillation signal and to decrement the count value for each pulse of the second oscillation signal.

9. A time encoding modulator as claimed in claim 8 wherein the hysteretic comparator comprises a digital comparator.

10. A time encoding modulator as claimed in claim 1 said first controlled oscillator comprises a ring oscillator.

11. A time encoding modulator as claimed in claim 2 wherein each of said first and second controlled oscillators comprise a current controlled oscillator.

12. A time encoding modulator as claimed in claim 11 wherein said current controlled oscillator comprises:
a ring oscillator comprising a plurality of inverters;
a control node coupled to supply terminals of said inverters for receiving the first or second oscillator driving signal as appropriate; and
a regulation amplifier configured to monitor a voltage at said control node to an oscillator reference voltage and to output a tuning voltage to said inverters to maintain the voltage at said control node to be equal to the oscillator reference voltage.

13. A time encoding modulator as claimed in claim 1 configured to receive an input analogue audio signal.

14. A time encoding modulator as claimed in claim 1 implemented as an integrated circuit.

15. An analogue to digital converter comprising a time-encoding modulator as claimed in claim 3, the analogue to digital converter further comprising:
a third controlled oscillator configured to receive an oscillator driving signal from said first output node of the time-encoding modulator and generate a third oscillation signal;
a fourth controlled oscillator configured to receive an oscillator driving signal from said second output node of the time-encoding modulator and generate a fourth oscillation signal; and
a counter configured to generate a count value based on the difference in the number of pulses of the third and fourth oscillations signals in a frame period defined a received clock signal.

16. An analogue to digital converter as claimed in claim 15 wherein the third and fourth controlled oscillators are the same type of controlled oscillator as said first and second controlled oscillators.

17. An electronic device comprising a time encoding modulator as claimed in claim 1.

18. An electronic device as claimed in claim 17 wherein the device is at least one of: a portable device; a device operable with battery power; a communication device; a mobile or cellular telephone or a smartphone; a computing device; a notebook, laptop or tablet computer; a wearable device; a device with voice control or voice activation functionality; an accessory device; a headset.

19. A time-encoding modulator comprising:
a first input node for receiving a first input signal;
a first output node for outputting a time-encoded signal;
a first controlled oscillator configured to be driven by a drive signal to produce a first oscillation signal with a frequency that depends on a signal level of the drive signal, wherein the drive signal corresponds to the first input signal combined with the time encoded signal;
an accumulator configured to provide an accumulator value based on a number of signal transitions of the first oscillation signal; and
a hysteretic comparator configured to compare, with hysteresis, said accumulator value with a reference value to generate the time-encoded.

20. A PWM modulator for receiving an input signal and outputting PWM signal, the modulator comprising:
an integrator module configured to receive the input signal combined with a feedback signal derived from the PWM signal and generate an accumulator value; and
a comparator configured to compare the accumulator value with a reference to generate the PWM signal;
wherein the integrator module comprises a controlled oscillator and an accumulator for providing an accumulator value based on the difference in a number of signal transitions in an output of the controlled oscillator,
wherein the controlled oscillator is driven at a drive node by a combined signal comprising said input signal combined with the feedback signal, and a frequency of the output of the controlled oscillator depends one drive strength of the combined signal at the drive node.

* * * * *

UNITED STATES PATENT AND TRADEMARK OFFICE
CERTIFICATE OF CORRECTION

PATENT NO. : 10,651,868 B2
APPLICATION NO. : 16/233581
DATED : May 12, 2020
INVENTOR(S) : Sri Ram Gupta It is certified that error appears in the above-identified patent and that said Letters Patent is hereby corrected as shown below:

In the Specification

1. In Column 8, Line 15, delete "delay r," and insert -- delay τ, --, therefor.

In the Claims

2. In Column 13, Line 10, in Claim 10, delete "claim 1 said" and insert -- claim 1 wherein said --, therefor.

3. In Column 14, Line 26, in Claim 19, delete "time-encoded." and insert -- time-encoded signal. --, therefor.

4. In Column 14, Line 43, in Claim 20, delete "depends one" and insert -- depends on one --, therefor.

Signed and Sealed this
Twentieth Day of September, 2022

Katherine Kelly Vidal
*Director of the United States Patent and Trademark Office*